United States Patent
Hara et al.

(10) Patent No.: US 8,907,038 B2
(45) Date of Patent: Dec. 9, 2014

(54) TYPICAL METAL CONTAINING POLYSILOXANE COMPOSITION, PROCESS FOR ITS PRODUCTION, AND ITS USES

(75) Inventors: Daiji Hara, Kanagawa (JP); Masato Shimizu, Kanagawa (JP)

(73) Assignee: Tosoh Corporation, Yamaguchi (JP)

( * ) Notice: Subject to any disclaimer, the term of this patent is extended or adjusted under 35 U.S.C. 154(b) by 35 days.

(21) Appl. No.: 13/704,014

(22) PCT Filed: Jun. 8, 2011

(86) PCT No.: PCT/JP2011/063174
§ 371 (c)(1),
(2), (4) Date: Dec. 13, 2012

(87) PCT Pub. No.: WO2011/158719
PCT Pub. Date: Dec. 22, 2011

(65) Prior Publication Data
US 2013/0090447 A1    Apr. 11, 2013

(30) Foreign Application Priority Data

Jun. 18, 2010   (JP) ................................ 2010-139215

(51) Int. Cl.
| | |
|---|---|
| *C08G 77/12* | (2006.01) |
| *H01L 23/29* | (2006.01) |
| *C08G 77/18* | (2006.01) |
| *C08L 83/04* | (2006.01) |
| *C09D 183/04* | (2006.01) |
| *C08G 77/20* | (2006.01) |
| *H01L 33/56* | (2010.01) |

(52) U.S. Cl.
CPC ....... *C08G 77/18* (2013.01); *H01L 2924/12044* (2013.01); *C08G 77/20* (2013.01); *H01L 23/296* (2013.01); *H01L 33/56* (2013.01); *C08G 77/12* (2013.01); *C08L 83/04* (2013.01); *C09D 183/04* (2013.01)
USPC .............................................. 528/31; 528/32

(58) Field of Classification Search
CPC ......... C08L 83/04; C08L 83/00; C08G 77/12; C08G 77/20; B01J 23/40; C07F 3/02; C07F 1/00; C07F 3/06; C07F 5/06
USPC .................................................... 528/31, 32
See application file for complete search history.

(56) References Cited

U.S. PATENT DOCUMENTS

2008/0262157 A1 * 10/2008 Nakata et al. .................. 525/100
2008/0303418 A1    12/2008 Fujita et al.

FOREIGN PATENT DOCUMENTS

| | | |
|---|---|---|
| JP | 4-178461 | 6/1992 |
| JP | 5-6946 | 1/1993 |
| JP | 2781279 | 5/1998 |
| JP | 11-106734 | 4/1999 |
| JP | 2004-186168 | 7/2004 |
| JP | 2006-2093 | 1/2006 |
| JP | 2006-93354 | 4/2006 |
| JP | 2006-241273 | 9/2006 |
| JP | 2010-43136 | 2/2012 |
| WO | 2011/065144 | 6/2011 |

OTHER PUBLICATIONS

Search report from International Application No. PCT/JP2011/063174, mail date is Sep. 27, 2011.
International Preliminary Report on Patentability PCT/JP2011/063174, mail date is Jan. 24, 2013.

* cited by examiner

*Primary Examiner* — Kuo-Liang Peng
(74) *Attorney, Agent, or Firm* — Greenblum & Bernstein, P.L.C.

(57) ABSTRACT

A material suitable for sealing an LED element or for a gas barrier layer for a resin component, and an LED device, an FPD device and a semiconductor device using it. A process for producing a polymer composition, which includes mixing and reacting as component (A), an unsaturated group-containing siloxane compound of the following formula (1):

$$\left[ \begin{array}{c} (H_2C)_a \diagup \\ | \\ Si-O \\ | \\ R^1 \end{array} \right]_m \quad (1)$$

wherein the siloxane structure is a chain or cyclic structure, as component (B), a siloxane compound having a structure of the following formula (2) wherein hydrogen is directly bonded to silicon, $$\left[ \begin{array}{c} H \\ | \\ Si-O \\ | \\ R^2 \end{array} \right]_n \quad (2)$$

wherein the siloxane structure is a chain or cyclic structure, as component (C), at least one member selected from the group consisting of organic metal compounds of Group 1, 2, 12, 13 and 14 metals of the periodic table, and as component (D), a metal catalyst of Group 8, 9 or 10 metal of the periodic table.

13 Claims, No Drawings

TYPICAL METAL CONTAINING POLYSILOXANE COMPOSITION, PROCESS FOR ITS PRODUCTION, AND ITS USES

TECHNICAL FIELD

The present invention relates to a polysiloxane composition containing typical metal, a process for its production and its uses. Particularly, it relates to a sealing material and a gas barrier material, using such a polysiloxane composition.

BACKGROUND ART

For flat-panel display (hereinafter referred to as FPD) represented by liquid crystal display and organic EL display, a glass substrate is used as a base material for its display panel, however, demand for its substitution by a transparent plastic substrate has been increasing with a view to thickness reduction, weight reduction, improvement of impact resistance as well as adaptability to a roll-to-roll process. Further, it has been attempted to form an organic transistor on a plastic substrate by means of an organic semiconductor, or to form LSI, a Si thin film solar cell, an organic dye-sensitized solar cell and an organic semiconductor solar cell.

Usually, in a case where such an element is formed on a commercially available plastic substrate, the formed element or device, such as a liquid crystal element, an organic EL element, a TFT element, a semiconductor element or a solar cell, is weak against water and oxygen, whereby dark spots or dead pixels are likely to be formed in the display on such a display panel, or a semiconductor device, a solar cell, etc. tend to fail to function properly and tend to be practically useless. Therefore, a gas barrier plastic substrate is required wherein a gas barrier property against steam and oxygen gas is imparted to a plastic substrate. On the other hand, a transparent plastic film having a gas barrier property is likely to be increasingly used, in place of a non-transparent aluminum foil laminate film, in applications as packaging materials for e.g. foods, drugs, electronic materials, electronic components, etc.

As a method to apply a transparent gas barrier layer on a transparent plastic substrate or a transparent plastic film, a PVD method (physical vapor deposition method) and a CVD method (chemical vapor deposition method) are available, but both of them use a vacuum process. Therefore, it is desired to form a gas barrier layer by an economically advantageous coating method which is not a vacuum process and has a higher throughput. However, as a gas barrier polymer to be used in a coating method, polyvinylidene chloride, polyvinyl alcohol, an ethylene/vinyl alcohol copolymer or nylon 6 may, for example, be available, but as compared with a gas barrier layer formed by the PVD method or the CVD method, water and oxygen were more likely to permeate therethrough, and its gas barrier property was low. That is, a coating material having a high gas barrier property is desired.

Further, also for a sealing material for an LED element, a material having a high gas barrier property is likewise desired. Patent Documents 1 and 2 propose a polysiloxane sealing material, and Patent Documents 3 and 4 propose an epoxy resin sealing material. However, their gas barrier property against water and oxygen, heat resistance, heat dissipation property, cracking resistance, and light resistance, particularly UV resistance, are inadequate, and improvements are desired.

PRIOR ART DOCUMENTS

Patent Documents

Patent Document 1: JP-A-2004-186168
Patent Document 2: JP-A-2006-93354
Patent Document 3: JP-A-05-6946
Patent Document 4: Japanese Patent No. 2,781,279

DISCLOSURE OF INVENTION

Technical Problem

The present invention has been made in view of the above-described problem, and it is an object of the present invention to provide a material suitable for sealing of an LED element, protection of wiring for an LED device, insulation and sealing of a power semiconductor or for a gas barrier layer for a transparent plastic substrate or transparent plastic film and to provide an LED device, a gas barrier component, a FPD device and a semiconductor device, using it.

Solution to Problem

The present inventors have found that a polymer composition obtained by hydrosilylation polymerization of an unsaturated group-containing siloxane compound and a siloxane compound having a structure wherein hydrogen is directly bonded to silicon, in the presence of a specific organic metal compound component, has a high gas barrier property and mechanical properties and thus is useful for sealing of an LED element, protection of wiring for an LED device or insulation and sealing of a power semiconductor, or for e.g. a gas barrier layer for a transparent plastic substrate or a transparent plastic film, and have thus arrived at the present invention.

The present invention provides a process for producing a polymer composition, which comprises mixing and reacting:

as component (A), an unsaturated group-containing siloxane compound of the following formula (1):

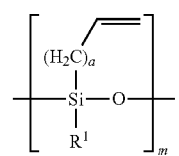

(1)

wherein $R^1$ is a hydrogen atom or a $C_{1-20}$ hydrocarbon group, m is an integer of at least 3, a is an integer of from 0 to 10, and the siloxane structure is a chain or cyclic structure, as component (B), a siloxane compound having a structure of the following formula (2) wherein hydrogen is directly bonded to silicon,

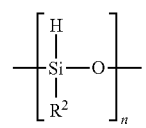

(2)

wherein $R^2$ is a $C_{1-20}$ hydrocarbon group, n is an integer of at least 3, and the siloxane structure is a chain or cyclic structure, as component (C), at least one member selected from the group consisting of organic metal compounds of Group 1, 2, 12, 13 and 14 metals of the periodic table, and as component (D), a metal catalyst of Group 8, 9 or 10 metal of the periodic table.

Further, the present invention provides a polymer composition produced by the above method.

Further, the present invention provides a sealing material, a gas barrier material or an insulating and sealing material for semiconductors, containing the above polymer composition.

Further, the present invention provides an LED device using the above sealing material.

Further, the present invention provides a resin component using the above gas barrier material.

Further, the present invention provides a semiconductor device using the above insulating and sealing material for semiconductors.

Advantageous Effects of Invention

The polymer composition of the present invention is useful as a sealing material, a protective film, a gas barrier material, etc., and is capable of providing a gas barrier resin component, an LED device, a semiconductor device, etc., excellent in the gas barrier property, mechanicals strength, UV resistance, heat resistance, etc. Further, it is also useful for a FPD device.

DESCRIPTION OF EMBODIMENTS

Now, the present invention will be described in detail.

In the present invention, in the presence of at least one organic metal compound selected from the group consisting of organic metal compounds of Group 1, 2, 12, 13 and 14 metals in the periodic table, the unsaturated group-containing siloxane compound of the formula (1) and the siloxane compound having a structure of the formula (2) wherein hydrogen is directly bonded to silicon, are subjected to hydrosilylation polymerization by a metal catalyst of Group 8, 9 or 10 metal of the periodic table, to produce a polymer composition.

The unsaturated group-containing siloxane compound of the formula (1) as component (A) is a chain or cyclic siloxane compound, siloxane oligomer or polysiloxane.

In the formula (1), $R^1$ is a hydrogen atom or a $C_{1-20}$ hydrocarbon group, and the hydrocarbon group may be saturated or unsaturated and may have a straight chain, branched chain or cyclic structure.

$R^1$ may, for example, be an alkyl group, an aryl group, an arylalkyl group, an alkylaryl group, an alkenyl group such as a vinyl group, or an alkynyl group such as an acetynyl group, having from 1 to 20 carbon atoms, preferably from 1 to 10 carbon atoms.

Specific examples for $R^1$ include groups of methyl, ethyl, n-propyl, isopropyl, n-butyl, i-butyl, sec-butyl, tert-butyl, n-pentyl, tert-amyl, n-hexyl, cyclohexyl, phenyl, toluoyl, naphthyl, cyclobutyl, cyclobutenyl, cyclopentyl, cyclopentadienyl, cyclohexyl, cyclohexenyl, cyclooctenyl, cyclooctadienyl, 1-adamantyl, etc.

$R^1$ is particularly preferably a linear alkyl group having at most 3 carbon atoms from the viewpoint of economical efficiency. However, in order to lower the refractive index of the polymer composition, a secondary or tertiary hydrocarbon group, such as isopropyl, sec-butyl, cyclohexyl, tert-butyl, tert-amyl or 1-adamantyl, is preferred, and in order to increase the refractive index of the polymer composition, an aromatic group such as phenyl, toluoyl or naphthyl is preferred.

In the formula (1), m is an integer of at least 3, and the upper limit is not particularly limited, but is preferably at most 100,000, particularly preferably at most 10,000, from the viewpoint of the viscosity or mixing efficiency.

In the formula (1), a is an integer of from 0 to 10. From the viewpoint of the reactivity of the terminal vinyl group and availability of the raw material, a is preferably an integer of from 0 to 4, more preferably 0 or 1. Further, in the formula (1), the siloxane structure is a chain or cyclic structure.

Examples in the case of a chain structure, include polyvinylhydrogensiloxane, polyvinylmethylsiloxane, polyvinylethylsiloxane, polyvinyl n-propylsiloxane, polyvinylisopropylsiloxane, polyvinyl n-butylsiloxane, polyvinylisobutylsiloxane, polyvinyl sec-butylsiloxane, polyvinyl tert-butylsiloxane, polyvinyl n-pentylsiloxane, polyvinylcyclopentylsiloxane, polyvinyl tert-amylsiloxane, polyvinyl n-hexylsiloxane, polyvinylcyclohexylsiloxane, polyvinyl n-heptylsiloxane, polyvinyl n-octylsiloxane, polyvinyl n-nonylsiloxane, polyvinyl n-decylsiloxane, polyvinylphenylsiloxane, polyvinyltoluoylsiloxane, polyvinylnaphthylsiloxane, etc.

There is no particular restriction as to the molecular weight of such a polysiloxane, however, the weight average molecular weight is usually from 500 to 5,000,000, particularly preferably from 1,000 to 1,000,000. When the weight average molecular weight is within such a range, the hydrosilylation reaction proceeds effectively, and it is possible to obtain a polymer composition excellent in the gas barrier property and mechanical properties. Further, an oligomer having a similar structure and having a weight average molecular weight of not higher than 500 is also within the scope of the present invention.

Examples in the case of a cyclic structure include 2,4,6-trivinylcyclotrisiloxane, 2,4,6-trivinyl-2,4,6-trimethylcyclotrisiloxane, 2,4,6-trivinyl-2,4,6-triethylcyclotrisiloxane, 2,4,6-trivinyl-2,4,6-tri n-propylcyclotrisiloxane, 2,4,6-trivinyl-2,4,6-triisopropylcyclotrisiloxane, 2,4,6-trivinyl-2,4,6-tri n-butylcyclotrisiloxane, 2,4,6-trivinyl-2,4,6-triisobutylcyclotrisiloxane, 2,4,6-trivinyl-2,4,6-tri sec-butylcyclotrisiloxane, 2,4,6-trivinyl-2,4,6-tri tert-butylcyclotrisiloxane, 2,4,6-trivinyl-2,4,6-tri n-pentylcyclotrisiloxane, 2,4,6-trivinyl-2,4,6-tricyclopentylcyclotrisiloxane, 2,4,6-trivinyl-2,4,6-tri tert-amylcyclotrisiloxane, 2,4,6-trivinyl-2,4,6-tri n-hexylcyclotrisiloxane, 2,4,6-trivinyl-2,4,6-tricyclohexylcyclotrisiloxane, 2,4,6-trivinyl-2,4,6-tri n-heptylcyclotrisiloxane, 2,4,6-trivinyl-2,4,6-tri n-octylcyclotrisiloxane, 2,4,6-trivinyl-2,4,6-tri n-nonylcyclotrisiloxane, 2,4,6-trivinyl-2,4,6-tri n-decylcyclotrisiloxane, etc.

Further, 2,4,6-trivinyl-2,4,6-triphenylcyclotrisiloxane, 2,4,6-trivinyl-2,4,6-tritoluoylcyclotrisiloxane, 2,4,6-trivinyl-2,4,6-trinaphthylcyclotrisiloxane, etc. may be mentioned.

Further, 6-membered cyclic siloxanes such as 2,4,6-triallylcyclotrisiloxane, 2,4,6-triallyl-2,4,6-trimethylcyclotrisiloxane, 2,4,6-triallyl-2,4,6-triethylcyclotrisiloxane, 2,4,6-triallyl-2,4,6-tri n-propylcyclotrisiloxane, 2,4,6-triallyl-2,4,6-triisopropylcyclotrisiloxane, etc. may be mentioned.

Further, 2,4,6,8-tetravinylcyclotetrasiloxane, 2,4,6,8-tetravinyl-2,4,6,8-tetramethylcyclotetrasiloxane, 2,4,6,8-tetravinyl-2,4,6,8-tetraethylcyclotetrasiloxane, 2,4,6,8-tetravinyl-2,4,6,8-tetra n-propylcyclotetrasiloxane, 2,4,6,8-tetravinyl-2,4,6,8-tetraisopropylcyclotetrasiloxane, 2,4,6,8-tetravinyl-2,4,6,8-tetra n-butylcyclotetrasiloxane, 2,4,6,8-tetravinyl-2,4,6,8-tetraisobutylcyclotetrasiloxane, 2,4,6,8-tetravinyl-2,4,6,8-tetra sec-butylcyclotetrasiloxane, 2,4,6,8-tetravinyl-2,4,6,8-tetra tert-butylcyclotetrasiloxane, 2,4,6,8-tetravinyl-2,4,6,8-tetra n-pentylcyclotetrasiloxane, 2,4,6,8-tetravinyl-2,4,6,8-tetracyclopentylcyclotetrasiloxane, 2,4,6, 8-tetravinyl-2,4,6,8-tetra tert-amylcyclotetrasiloxane, 2,4,6,8-tetravinyl-2,4,6,8-tetra n-hexylcyclotetrasiloxane, 2,4,6,8-tetravinyl-2,4,6,8-tetracyclohexylcyclotetrasiloxane, 2,4,6,8-tetravinyl-2,4,6,8-tetra n-heptylcyclotetrasiloxane, 2,4,6,8-tetravinyl-2,4,6,8-tetra n-octylcyclotetrasiloxane, 2,4,6,8-tetravinyl-2,4,6,8-tetra n-nonylcyclotetrasiloxane, 2,4,6,8-tetravinyl-2,4,6,8-tetra n-decylcyclotetrasiloxane, etc. may be mentioned.

Further, a cyclotetrasiloxane such as 2,4,6,8-tetravinyl-2,4,6,8-tetraphenylcyclotetrasiloxane, 2,4,6,8-tetravinyl-2,4,6,8-tetratoluoylcyclotrisiloxane, 2,4,6,8-tetravinyl-2,4,6,8-tetranaphthylcyclotetrasiloxane, etc. may be mentioned.

Further, 8-membered cyclic siloxanes such as 2,4,6,8-tetraallylcyclotetrasiloxane, 2,4,6,8-tetraallyl-2,4,6,8-tetramethylcyclotetrasiloxane, 2,4,6,8-tetraallyl-2,4,6,8-tetraethylcyclotetrasiloxane, 2,4,6,8-tetraallyl-2,4,6,8-tetra n-propylcyclotetrasiloxane, 2,4,6,8-tetraallyl-2,4,6,8-tetraisopropylcyclotetrasiloxane, etc. may be mentioned.

Further, 2,4,6,8,10-pentavinylcyclopentasiloxane, 2,4,6,8,10-pentavinyl-2,4,6,8,10-pentamethylcyclopentasiloxane, 2,4,6,8,10-pentavinyl-2,4,6,8,10-pentaethylcyclopentasiloxane, 2,4,6,8,10-pentavinyl-2,4,6,8,10-penta n-propylcyclopentasiloxane, 2,4,6,8,10-pentavinyl-2,4,6,8,10-pentaisopropylcyclopentasiloxane, 2,4,6,8,10-pentavinyl-2,4,6,8,10-penta n-butylcyclopentasiloxane, 2,4,6,8,10-pentavinyl-2,4,6,8,10-pentaisobutylcyclopentasiloxane, 2,4,6,8,10-pentavinyl-2,4,6,8,10-penta sec-butylcyclopentasiloxane, 2,4,6,8,10-pentavinyl-2,4,6,8,10-penta tert-butylcyclopentasiloxane, 2,4,6,8,10-pentavinyl-2,4,6,8,10-penta n-pentylcyclopentasiloxane, 2,4,6,8,10-pentavinyl-2,4,6,8,10-pentacyclopentylcyclopentasiloxane, 2,4,6,8,10-pentavinyl-2,4,6,8,10-penta tert-amylcyclopentasiloxane, 2,4,6,8,10-pentavinyl-2,4,6,8,10-penta n-hexylcyclopentasiloxane, 2,4,6,8,10-pentavinyl-2,4,6,8,10-pentacyclohexylcyclopentasiloxane, 2,4,6,8,10-pentavinyl-2,4,6,8,10-penta n-heptylcyclopentasiloxane, 2,4,6,8,10-pentavinyl-2,4,6,8,10-penta n-octylcyclopentasiloxane, 2,4,6,8,10-pentavinyl-2,4,6,8,10-penta n-nonylcyclopentasiloxane, 2,4,6,8,10-pentavinyl-2,4,6,8,10-penta n-decylcyclopentasiloxane, etc. may be mentioned.

Further, 2,4,6,8,10-pentavinyl-2,4,6,8,10-pentaphenylcyclopentasiloxane, 2,4,6,8,10-pentavinyl-2,4,6,8,10-pentatoluoylcyclotrisiloxane, 2,4,6,8,10-pentavinyl-2,4,6,8,10-pentanaphthylcyclopentasiloxane, etc. may be mentioned.

Further, 10-membered cyclic siloxanes such as 2,4,6,8,10-pentaallylcyclopentasiloxane, 2,4,6,8,10-pentaallyl-2,4,6,8,10-pentamethylcyclopentasiloxane, 2,4,6,8,10-pentaallyl-2,4,6,8-pentaethylcyclopentasiloxane, 2,4,6,8,10-pentaallyl-2,4,6,8,10-penta n-propylcyclopentasiloxane, 2,4,6,8,10-pentaallyl-2,4,6,8,10-pentaisopropylcyclopentasiloxane, etc. may be mentioned.

Further, 2,4,6,8,10,12-hexavinyl-2,4,6,8,10,12-hexamethylcyclohexasiloxane, 2,4,6,8,10,12,14-heptavinyl-2,4,6,8,10,12,14-heptamethylcycloheptasiloxane, 2,4,6,8,10,12,14,16-octavinyl-2,4,6,8,10,12,14,16-octamethylcyclooctasiloxane, 2,4,6,8,10,12,14,16,18-nonavinyl-2,4,6,8,10,12,14,16,18-nonamethylcyclononasiloxane, 2,4,6,8,10,12,14,16,18,20-decatvinyl-2,4,6,8,10,12,14,16,18,20-decamethylcyclodecasiloxane, 2,4,6,8,10,12,14,16,18,20,22-undecavinyl-2,4,6,8,10,12,14,16,18,20,22-undecamethylcycloundecasiloxane, 2,4,6,8,10,12,14,16,18,20,22,24-dodecavinyl-2,4,6,8,10,12,14,16,18,20,22,24-dodecamethylcyclododecasiloxane, etc. may be mentioned.

Further, 2,4,6,8,10,12-hexavinyl-2,4,6,8,10,12-hexaethylcyclohexasiloxane, 2,4,6,8,10,12,14-heptavinyl-2,4,6,8,10,12,14-heptaethylcycloheptasiloxane, 2,4,6,8,10,12,14,16-octavinyl-2,4,6,8,10,12,14,16-octaethylcyclooctasiloxane, 2,4,6,8,10,12,14,16,18-nonavinyl-2,4,6,8,10,12,14,16,18-nonaethylcyclononasiloxane, 2,4,6,8,10,12,14,16,18,20-decavinyl-2,4,6,8,10,12,14,16,18,20-decaethylcyclodecasiloxane, 2,4,6,8,10,12,14,16,18,20,22-undecavinyl-2,4,6,8,10,12,14,16,18,20,22-undecaethylcycloundecasiloxane, 2,4,6,8,10,12,14,16,18,20,22,24-dodecavinyl-2,4,6,8,10,12,14,16,18,20,22,24-dodecaethylcyclododecasiloxane, etc. may be mentioned.

Further, 2,4,6,8,10,12-hexavinyl-2,4,6,8,10,12-hexapropylcyclohexasiloxane, 2,4,6,8,10,12,14-heptavinyl-2,4,6,8,10,12,14-heptapropylcycloheptasiloxane, 2,4,6,8,10,12,14,16-octavinyl-2,4,6,8,10,12,14,16-octapropylcyclooctasiloxane, 2,4,6,8,10,12,14,16,18-nonavinyl-2,4,6,8,10,12,14,16,18-nonapropylcyclononasiloxane, 2,4,6,8,10,12,14,16,18,20-decavinyl-2,4,6,8,10,12,14,16,18,20-decapropylcyclodecasiloxane, 2,4,6,8,10,12,14,16,18,20,22-undecavinyl-2,4,6,8,10,12,14,16,18,20,22-undecapropylcycloundecasiloxane, 2,4,6,8,10,12,14,16,18,20,22,24-dodecavinyl-2,4,6,8,10,12,14,16,18,20,22,24-dodecapropylcyclododecasiloxane, etc. may be mentioned.

Further, 2,4,6,8,10,12-hexavinyl-2,4,6,8,10,12-hexaisopropylcyclohexasiloxane, 2,4,6,8,10,12,14-heptavinyl-2,4,6,8,10,12,14-heptaisopropylcycloheptasiloxane, 2,4,6,8,10,12,14,16-octavinyl-2,4,6,8,10,12,14,16-octaisopropylcyclooctasiloxane, 2,4,6,8,10,12,14,16,18-nonavinyl-2,4,6,8,10,12,14,16,18-nonaisopropylcyclononasiloxane, 2,4,6,8,10,12,14,16,18,20-decavinyl-2,4,6,8,10,12,14,16,18,20-decaisopropylcyclodecasiloxane, 2,4,6,8,10,12,14,16,18,20,22-undecavinyl-2,4,6,8,10,12,14,16,18,20,22-undecaisopropylcycloundecasiloxane, 2,4,6,8,10,12,14,16,18,20,22,24-dodecavinyl-2,4,6,8,10,12,14,16,18,20,22,24-dodecaisopropylcyclododecasiloxane, etc. may be mentioned.

Further, 2,4,6,8,10,12-hexavinyl-2,4,6,8,10,12-hexa n-butylcyclohexasiloxane, 2,4,6,8,10,12,14-heptavinyl-2,4,6,8,10,12,14-hepta n-butylcycloheptasiloxane, 2,4,6,8,10,12,14,16-octavinyl-2,4,6,8,10,12,14,16-octa n-butylcyclooctasiloxane, 2,4,6,8,10,12,14,16,18-nonavinyl-2,4,6,8,10,12,14,16,18-nona n-butylcyclononasiloxane, 2,4,6,8,10,12,14,16,18,20-decavinyl-2,4,6,8,10,12,14,16,18,20-deca n-butylcyclodecasiloxane, 2,4,6,8,10,12,14,16,18,20,22-undecavinyl-2,4,6,8,10,12,14,16,18,20,22-undeca n-butylcycloundecasiloxane, 2,4,6,8,10,12,14,16,18,20,22,24-dodecavinyl-2,4,6,8,10,12,14,16,18,20,22,24-dodeca n-butylcyclododecasiloxane, etc. may be mentioned.

Further, 2,4,6,8,10,12-hexavinyl-2,4,6,8,10,12-hexaisobutylcyclohexasiloxane, 2,4,6,8,10,12,14-heptavinyl-2,4,6,8,10,12,14-heptaisobutylcycloheptasiloxane, 2,4,6,8,10,12,14,16-octavinyl-2,4,6,8,10,12,14,16-octaisobutylcyclooctasiloxane, 2,4,6,8,10,12,14,16,18-nonavinyl-2,4,6,8,10,12,14,16,18-nonaisobutylcyclononasiloxane, 2,4,6,8,10,12,14,16,18,20-decavinyl-2,4,6,8,10,12,14,16,18,20-decaisobutylcyclodecasiloxane, 2,4,6,8,10,12,14,16,18,20,22-undecavinyl-2,4,6,8,10,12,14,16,18,20,22-undecaisobutylcycloundecasiloxane, 2,4,6,8,10,12,14,16,18,20,22,24-dodecavinyl-2,4,6,8,10,12,14,16,18,20,22,24-dodecaisobutylcyclododecasiloxane, etc. may be mentioned.

Further, 2,4,6,8,10,12-hexavinyl-2,4,6,8,10,12-hexa sec-butylcyclohexasiloxane, 2,4,6,8,10,12,14-heptavinyl-2,4,6,8,10,12,14-hepta sec-butylcycloheptasiloxane, 2,4,6,8,10,12,14,16-octavinyl-2,4,6,8,10,12,14,16-octa sec-butylcyclooctasiloxane, 2,4,6,8,10,12,14,16,18-nonavinyl-2,4,6,8,10,12,14,16,18-nona sec-butylcyclononasiloxane, 2,4, 6,8,10,12,14,16,18,20-decavinyl-2,4,6,8,10,12,14,16,18,20-deca sec-butylcyclodecasiloxane, 2,4,6,8,10,12,14,16,18,20,22-undecavinyl-2,4,6,8,10,12,14,16,18,20,22-undeca sec-butylcycloundecasiloxane, 2,4,6,8,10,12,14,16,18,20,22,24-dodecavinyl-2,4,6,8,10,12,14,16,18,20,22,24-dodeca sec-butylcyclododecasiloxane, etc. may be mentioned.

Further, 12-membered to 24-membered cyclic siloxanes such as 2,4,6,8,10,12-hexavinyl-2,4,6,8,10,12-hexa tert-butylcyclohexasiloxane, 2,4,6,8,10,12,14-heptavinyl-2,4,6,8,10,12,14-hepta tert-butylcycloheptasiloxane, 2,4,6,8,10,12,14,16-octavinyl-2,4,6,8,10,12,14,16-octa tert-butylcyclooctasiloxane, 2,4,6,8,10,12,14,16,18-nonavinyl-2,4,6,8,10,12,14,16,18-nona tert-butylcyclononasiloxane, 2,4,6,8,10,12,14,16,18,20-decavinyl-2,4,6,8,10,12,14,16,18,20-deca tert-butylcyclodecasiloxane, 2,4,6,8,10,12,14,16,18,20,22-undecavinyl-2,4,6,8,10,12,14,16,18,20,22-undeca tert-butylcycloundecasiloxane, 2,4,6,8,10,12,14,16,18,20,22,24-dodecavinyl-2,4,6,8,10,12,14,16,18,20,22,24-dodeca tert-butylcyclododecasiloxane, etc. may be mentioned.

26-Membered or higher membered cyclic siloxanes having similar structures may also be within the scope of the present invention.

When an unsaturated group-containing siloxane compound having a cyclic structure is used, there may be a case where the heat resistance and cracking resistance of the polymer composition to be thereby formed, are improved.

It is also within the scope of the present invention to use a mixture of the above siloxane compounds having chain and cyclic structures.

The siloxane compound having a structure of the formula (2) wherein hydrogen is directly bonded to silicon, as component (B), is a chain or cyclic siloxane compound, siloxane oligomer or polysiloxane.

In the formula (2), $R^2$ is a $C_{1-20}$ hydrocarbon group, and the hydrocarbon group may be saturated or unsaturated and may have a straight chain, branched chain or cyclic structure.

The hydrocarbon group for $R^2$ may, for example, be an alkyl group, an aryl group, an arylalkyl group, an alkylaryl group, an alkenyl group such as a vinyl group, or an alkynyl group such as an acetynyl group, having from 1 to 20 carbon atoms, preferably from 1 to 10 carbon atoms.

Specific examples for $R^2$ include methyl, ethyl, n-propyl, isopropyl, n-butyl, i-butyl, sec-butyl, tert-butyl, n-pentyl, tert-amyl, n-hexyl, cyclohexyl, phenyl, toluoyl, naphthyl, cyclobutyl, cyclobutenyl, cyclopentyl, cyclopentadienyl, cyclohexyl, cyclohexenyl, cyclooctenyl, cyclooctadienyl, 1-adamantyl, etc.

$R^2$ is particularly preferably a straight chain alkyl having at most 3 carbon atoms from the viewpoint of economical efficiency. However, in order to lower the refractive index of the polymer composition, a secondary or tertiary hydrocarbon group such as isopropyl, sec-butyl, cyclohexyl, tert-butyl, tert-amyl or 1-adamantyl, is preferred, and in order to increase the refractive index of the polymer composition, an aromatic group such as phenyl, toluoyl or naphthyl, is preferred.

In the formula (2), n is an integer of at least 3, and the upper limit is not particularly limited, but is preferably at most 10,000 from the viewpoint of the viscosity and mixing efficiency. Further, in the formula (2), the siloxane structure is a chain or cyclic structure.

Examples in the case of a cyclic structure include polymethylsiloxane, polyethylsiloxane, poly n-propylsiloxane, polyisopropylsiloxane, poly n-butylsiloxane, poyisobutylsiloxane, poly sec-butylsiloxane, poly tert-butylsiloxane, poly n-pentylsiloxane, polycyclopentylsiloxane, poly tert-amylsiloxane, poly n-hexylsiloxane, polycyclohexylsiloxane, poly n-heptylsiloxane, poly n-octylsiloxane, poly n-nonylsiloxane, poly n-decylsiloxane, polyphenylsiloxane, polytoluoylsiloxane, polynaphthylsiloxane, etc.

There is no particular restriction as to the molecular weight of such a polysiloxane, but the weight average molecular weight is usually from 500 to 5,000,000, particularly preferably from 1,000 to 1,000,000. When the weight average molecular weight is within such a range, the hydrosilylation reaction proceeds efficiently, and a polymer composition excellent in the gas barrier property and mechanical properties may be obtained. Further, an oligomer having a similar structure and having a weight average molecular weight of not higher than 500 is also within the scope of the present invention.

Examples in the case of a cyclic structure include trimethylcyclotrisiloxane, tetramethylcyclotetrasiloxane, pentamethylcyclopentasiloxane, hexamethylcyclohexasiloxane, heptamethylcycloheptasiloxane, octamethylcyclooctasiloxane, nonamethylcyclononasiloxane, decamethylcyclodecasiloxane, undecamethylcycloundecasiloxane, dodecamethylcyclododecasiloxane, etc.

Further, triethylcyclotrisiloxane, tetraethylcyclotetrasiloxane, pentaethylcyclopentasiloxane, hexaethylcyclohexasiloxane, heptaethylcycloheptasiloxane, octaethylcyclooctasiloxane, nonaethylcyclononasiloxane, decaethylcyclodecasiloxane, undecaethylcycloundecasiloxane, dodecaethylcyclododecasiloxane, etc. may be mentioned.

Further, tri n-propylcyclotrisiloxane, tetra n-propylcyclotetrasiloxane, penta n-propylcyclopentasiloxane, hexa n-propylcyclohexasiloxane, hepta n-propylcycloheptasiloxane, octa n-propylcyclooctasiloxane, nona n-propylcyclononasiloxane, deca n-propylcyclodecasiloxane, undeca n-propylcycloundecasiloxane, dodeca n-propylcyclododecasiloxane, etc. may be mentioned.

Further, triisopropylcyclotrisiloxane, tetraisopropylcyclotetrasiloxane, pentaisopropylcyclopentasiloxane, hexaisopropylcyclohexasiloxane, heptaisopropylcycloheptasiloxane, octaisopropylcyclooctasiloxane, nonaisopropylcyclononasiloxane, decaisopropylcyclodecasiloxane, undecaisopropylcycloundecasiloxane, dodecaisopropylcyclododecasiloxane, etc. may be mentioned.

Further, tri n-butylcyclotrisiloxane, tetra n-butylcyclotetrasiloxane, penta n-butylcyclopentasiloxane, hexa n-butylcyclohexasiloxane, hepta n-butylcycloheptasiloxane, octa n-butylcyclooctasiloxane, nona n-butylcyclononasiloxane, deca n-butylcyclodecasiloxane, undeca n-butylcycloundecasiloxane, dodeca n-butylcyclododecasiloxane, etc. may be mentioned.

Further, triisobutylcyclotrisiloxane, tetraisobutylcyclotetrasiloxane, pentaisobutylcyclopentasiloxane, hexaisobutylcyclohexasiloxane, heptaisobutylcycloheptasiloxane, octaisobutylcyclooctasiloxane, nonaisobutylcyclononasiloxane, decaisobutylcyclodecasiloxane, undecaisobutylcycloundecasiloxane, dodecaisobutylcyclododecasiloxane, etc. may be mentioned.

Further, tri sec-butylcyclotrisiloxane, tetra sec-butylcyclotetrasiloxane, penta sec-butylcyclopentasiloxane, hexa sec-butylcyclohexasiloxane, hepta sec-butylcycloheptasiloxane, octa sec-butylcyclooctasiloxane, nona sec-butylcyclononasiloxane, deca sec-butylcyclodecasiloxane, undeca sec-butylcycloundecasiloxane, dodeca sec-butylcyclododecasiloxane, etc. may be mentioned.

Further, tri tert-butylcyclotrisiloxane, tetra tert-butylcyclotetrasiloxane, penta tert-butylcyclopentasiloxane, hexa tert-butylcyclohexasiloxane, hepta tert-butylcycloheptasiloxane, octa tert-butylcyclooctasiloxane, nona tert-butylcyclononasiloxane, deca tert-butylcyclodecasiloxane, undeca tert-butylcycloundecasiloxane, dodeca tert-butylcyclododecasiloxane, etc. may be mentioned.

Also 26-membered or higher membered cyclic siloxanes having similar structures are within the scope of the present invention.

When a siloxane compound of the formula (2) having a cyclic structure is used, there may be a case where the heat resistance and cracking resistance of the polymer composition to be formed, are improved.

It is also within the scope of the present invention to use a mixture of the above siloxane compounds having chain and cyclic structures.

The organic metal compound of Group 1, 2, 12, 13 or 14 metal in the periodic table, as component (C), may be an organic metal compound comprising an organic group and a metal of lithium, magnesium, zinc, tin or aluminum. As the organic group, an alkyl group may be mentioned as a representative. As such an alkyl group, a straight chain or branched chain $C_{1-20}$ alkyl group may be used.

Specifically, for example, n-butyllithium, diethylmagnesium, diethylzinc, trimethylaluminum, triethylaluminum, tri-1-butylaluminum, tri-n-butylaluminum, tri-n-decylaluminum, tetraethyltin, tetrabutyltin, etc. may be mentioned.

Among them, a straight chain or branched chain $C_{1-20}$ alkylaluminum or alkylzinc is preferred.

Specific examples include trimethylaluminum, triethylaluminum, tri-n-propylaluminum, tri n-butylaluminum, triisobutylaluminum, triisoprenylaluminum, tri n-hexylaluminum, tri n-octylaluminum, tri(2-methylpentyl)aluminum, dimethylaluminum chloride, methylaluminum sesquichloride, methylaluminum dichloride, diethylaluminum chloride, ethylaluminum sesquichloride, ethylaluminum dichloride, di n-propylaluminum chloride, di n-butylaluminum chloride, diisobutylaluminum chloride, isobutylaluminum dichloride, diethylaluminum iodide, diethylaluminum fluoride, diethylaluminum bromide, diisobutylaluminum hydride, diethylaluminum hydride, diethylaluminum methoxide, diethylaluminum ethoxide, diisobutylaluminum methoxide, diisobutylaluminum ethoxide, diisobutylaluminum isopropoxide, dimethylzinc, methylzinc chloride, methylzinc bromide, methylzinc iodide, methylzinc fluoride, diethylzinc, ethylzinc chloride, ethylzinc bromide, ethylzinc iodide, ethylzinc fluoride, etc.

Particularly preferred are trimethylaluminum, triethylaluminum, triisobutylaluminum, dimethylzinc, diethylzinc, etc. containing no halogen.

These organic metal compounds may be used alone or as a mixture of two or more of them.

As the metal catalyst of Group 8, 9 or 10 metal of the periodic table, as component (D), it is possible to use at least one member selected from the group consisting of metal catalysts of iron, ruthenium, osmium, cobalt, rhodium, iridium, nickel, palladium and platinum. From the viewpoint of the catalytic activities, preferred is a ruthenium catalyst or a platinum catalyst, and particularly preferred is a platinum catalyst.

Specific platinum catalysts may, for example, be platinum tetrachloride, platinum dichloride, platinum tetrabromide, platinum dibromide, platinum tetraiodide, platinum diiodide, hexachloroplatinic (IV) acid, hexabromoplatinic (IV) acid, hexaiodoplatinic (IV) acid, hexachloroplatinic (IV) acid hexahydrate, hexabromoplatinic (IV) acid hexahydrate, hexaiodoplatinic (IV) acid hexahydrate, etc. As the platinum catalyst, particularly preferred is a platinum compound having such a compound reduced by a reducing agent, or a metal complex of platinum synthesized from a silane compound having a vinyl group, a siloxane compound and the above platinum compound.

The silane compound having a vinyl group is preferably a compound having at least two vinyl groups in one molecule from the viewpoint of the catalytic activities.

Specifically, a cyclic siloxane having vinyl groups, such as 1,1,3,3-tetramethyl-1,3-divinyldisiloxane, 1,1,3,3-tetravinyl-1,3-dimethyldisiloxane or the above-mentioned component (A) may be mentioned.

Particularly preferred is a platinum catalyst prepared by mixing the above platinum compound and a cyclic siloxane having a silicon atom to which a secondary or tertiary carbon atom is directly bonded and which has an alkenyl group:

(3)

wherein each of $R^3$ and $R^4$ which are independent of each other, is a $C_{1-20}$ hydrocarbon group, or $R^3$ and $R^4$ are bonded together to form a cyclic structure, $R^5$ is a $C_{1-20}$ hydrocarbon group, or a hydrogen atom, and b is an integer of at least 3, and reducing the mixture. By using such a platinum catalyst, it is possible to produce a polycyclic siloxane having high cracking resistance and mechanical properties.

The process for producing a polymer composition, which comprises mixing and reacting components (A), (B), (C) and (D) is not particularly limited, however, the following process may be used.

As the method for mixing components (A), (B), (C) and (D), any mixing method may be employed. For example, there may be (1) a method of preliminarily mixing components (A) and (B), followed by adding and mixing components (C) and (D) sequentially thereto, (2) a method of preliminarily mixing components (A) and (C), followed by adding and mixing components (B) and (D) sequentially thereto, (3) a method of preliminarily mixing components (A), (B) and (C), followed by adding and mixing component (D) thereto, or (4) a method of simultaneously mixing components (A), (B), (C) and (D).

The conditions for reacting components (A), (B), (C) and (D) in the case of producing the polymer composition are not particularly limited, however, the following conditions may be used.

Component (A) or (B) may be used as a reaction medium by itself, however, an inert solvent may be used as a reaction medium. The useful solvent for the reaction is not particularly limited so long as it is one which is used in this technical field, and for example, a saturated hydrocarbon such as n-pentane, i-pentane, n-hexane, cyclohexane, n-heptane or n-decane; an unsaturated hydrocarbon such as toluene, xylene or decene-1; an ether such as diethyl ether, dipropyl ether, tert-butyl methyl ether, dibutyl ether, cyclopentyl methyl ether or tetrahydrofuran; or an alcohol such as methanol, ethanol, isopropanol, n-butanol, sec-butanol, tert-butanol or 2-ethylhexanol, may be used. Further, a solvent mixture of such solvents may also be used.

The reaction temperature in the case of the reaction is usually within a range of −100 to 200° C., preferably within a range of −85 to 150° C., as a temperature which is commonly industrially used. The pressure condition for the reaction may be under elevated pressure, ordinary pressure or reduced pressure.

The stoichiometric proportions of components (B), (C) and (D) to component (A) are not particularly limited. Usually, however, to 1 mol of the Si content in component (A), the Si content in component (B) is within a range of from 0.01 mol to 1,000 mol, preferably from 0.1 mol to 100 mol. If the content is outside this range, the mechanical strength of the polymer composition film to be formed may decrease, or cracking or peeling may result in the polymer composition film. Further, to 1 mol of the Si content in component (A), the content of the organic metal compound as component (C) is within a range of from 0.001 mol to 100 mol, preferably from 0.01 mol to 10 mol. If the content is outside this range, the mechanical strength of the polymer composition film to be formed may decrease, or whitening, or cracking or peeling may result in the polymer composition film.

To 1 mol of the Si content in component (A), the metal content as component (D) is within a range of from 0.00001 mol to 10 mol, preferably from 0.0001 mol to 1 mol. If the content is outside this range, formation of the polymer composition tends to be difficult, whereby the film may not be formed, or the polymer composition film may undergo coloration.

The produced polymer composition may be used as it is, but may be purified by means of a purification means such as filtration using a glass filter or a sintered porous body, normal pressure or reduced pressure distillation, or column separation using silica, alumina or a polymer gel. At that time, such means maybe used in combination, as the case requires.

As the reactor to be used for the reaction, one commonly used in this technical field may suitably be used. A stirring vessel type reactor, a fluidized bed type reactor or a circulation type reactor may be used, and the polymerization operation may be carried out by any of a continuous system, a semibatch system and a batch system. Further, it may be carried out dividedly in two or more steps under different polymerization reaction conditions.

It is also within the scope of the present invention to add an oxygen atom-containing organic compound of Group 4 metal in order to increase the refractive index during or after the preparation of the polymer composition.

The oxygen atom-containing organic compound of Group 4 metal may, for example, be a compound represented by the following formula (4):

   (4)

wherein M is Ti, Zr or Hf, $R^7$ is a $C_{1-20}$, preferably $C_{1-10}$, hydrocarbon group, X is fluorine, chlorine, bromine or iodine, p, q, u and r are $p \geq 0$, $q \geq 0$, $u \geq 1$ and $r \geq 0$, respectively, and represent numbers compatible with atomic valences of Ti, Zr and Hf, and y is an integer. Particularly preferred is an oxygen atom-containing organic compound of Ti, Zr or Hf, which satisfies $0 \leq p \leq 1$, $1 \leq u \leq 2$, and $1 \leq q \leq 6$.

The hydrocarbon group for $R^7$ may, for example, be a straight chain or branched alkyl group, a cycloalkyl group, an arylalkyl group, an aryl group or an alkylaryl group.

Specific examples of the formula (4) include an alkoxytitanium compound such as titanium tetramethoxide, titanium tetraethoxide, titanium tetra-n-propoxide, titanium tetra-i-propoxide, titanium tetra-n-butoxide, titanium tetra-1-butoxide, tetra(n-nonyl) titanate, tetra(2-ethylhexyl) titanate, tetracresyl titanate or hexa-1-propoxy dititanate; a halogenated titanium compound such as tetrachlorotitanium; a halogenated zirconium such as tetrachlorozirconium or dichlorozirconium oxide; an alkoxyzirconium compound such as tetraethoxyzirconium or tetrabutoxyzirconium; a halogenated hafnium compound such as tetrachlorohafnium; an alkoxyhafnium compound such as tetraethoxyhafnium or tetrabutoxyhafnium; etc.

It is also within the scope of the present invention to use a plurality of oxygen atom-containing organic compounds of Group 4 metal having different hydrocarbon groups. Such oxygen atom-containing organic compounds of Group 4 metal may be used alone, or two or more of them may be used as mixed or after reacted.

Further, it is also within the scope of the present invention to add a compound such as an alcohol, an organic silanol or an organic silicon compound, which may be reacted or complexed with the organic metal compound of Group 1, 2, 12, 13 or 14 metal of the periodic table as component (C).

The alcohol which may be added, is a $C_{1-18}$ linear or branched aliphatic alcohol, an alicyclic alcohol or an aromatic alcohol.

Examples of the alcohol include methanol, ethanol, n-propanol, i-propanol, n-butanol, iso-butanol, sec-butanol, t-butanol, n-hexanol, 2-ethylhexanol, n-octanol, i-octanol, n-stearyl alcohol, cyclopentanol, cyclohexanol, ethylene glycol, etc. Further, benzylalcohol and a phenol such as phenol, cresol, xylenol or hydroquinone, may, for example, be exemplified.

Further, the organic silanol which may be added, is selected from compounds having an alkyl group, a cycloalkyl group, an arylalkyl group, an aryl group or an alkylaryl group, which have at least one hydroxy group and wherein the organic group has from 1 to 12 carbon atoms, preferably from 1 to 6 carbon atoms.

For example, trimethylsilanol, triethylsilanol, triphenylsilanol, tert-butyldimethylsilanol, vinyldimethylsilanol, etc. may be mentioned.

The organic silicon compound which may be added is a compound represented by the following formula (5):

   (5)

wherein each of $R^8$ and $R^9$ which are independent of each other, is a $C_{1-20}$, preferably $C_{1-10}$, hydrocarbon group, e, f, g and h are $e \geq 0$, $f > 0$, $g \geq 1$ and $h \geq 0$, respectively, and represent numbers compatible with the atomic valence of Si, and d is an integer.

The hydrocarbon group for $R^8$ and $R^9$ may, for example, be a linear or branched alkyl group, a cycloalkyl group, an arylalkyl group, an aryl group, an alkylaryl group, etc.

Specific examples include tetramethoxysilane, tetraethoxysilane, tetra-n-propoxysilane, tetra-1-propoxysilane, tetra-n-butoxysilane, tetra-1-pentoxysilane, tetra-n-hexoxysilane, tetraphenoxysilane, tetrakis(2-ethylhexoxy)silane, tetrakis(2-ethylbutoxy)silane, tetrakis(2-methoxyethoxy)silane, methyltrimethoxysilane, ethyltrimethoxysilane, n-butyltrimethoxysilane, phenyltrimethoxysilane, vinyltrimethoxysilane, chloromethyltrimethoxysilane, 3-chloropropyltrimethoxysilane, 4-chlorophenyltrimethoxysilane, trimethoxysilane, methyltriethoxysilane, ethyltriethoxysilane, n-propyltriethoxysilane, n-butyltriethoxysilane, phenyltriethoxysilane, vinyltriethoxysilane, etc.

Further, 3-aminopropyltriethoxysilane, triethoxysilane, ethyltri-1-propoxysilane, vinyltri-1-propoxysilane, i-pentyltri-n-butoxysilane, methyltri-1-pentoxysilane, ethyltri-1-pentoxysilane, methyltri-n-hexoxysilane, phenyltri-1-pentoxysilane, n-propyltrimethoxysilane, i-propyltrimethoxysilane, i-butyltrimethoxysilane, dimethyldimethoxysilane, methylphenyldimethoxysilane, diphenyldimethoxysilane, methyldimethoxysilane, dimethyldiethoxysilane, diethyldiethoxysilane, diphenyldiethoxysilane, methyldodecyldiethoxysilane, methyloctadecyldiethoxysilane, methylphenyldiethoxysilane, methyldiethoxysilane, dibenzyldiethoxysilane, diethoxysilane, dimethyldi-n-butoxysilane, etc. may be mentioned.

Further, an alkoxysilane or aryloxysilane, such as dimethyldi-1-pentoxysilane, diethyldi-1-pentoxysilane, di-1-butyldi-1-pentoxysilane, diphenyldi-1-pentoxysilane, diphenyldi-n-octoxysilane, diisobutyldimethoxysilane, trimethylmethoxysilane, trimethylethoxysilane, dimethylethoxysilane, trimethyl-1-propoxysilane, trimethyl-n-propoxysilane, trimethyl-t-butoxysilane, trimethyl-1-butoxysilane, trimethyl-n-butoxysilane, trimethyl-n-pentoxysilane or trimethylphenoxysilane; a haloalkoxysilane such as dichlorodiethoxysilane, dichlorodiphenoxysilane or tribromoethoxysilane; a haloaryloxysilane; etc. may be mentioned.

Further, isopropyltrimethoxysilane, diisopropyldimethoxysilane, triisopropylmethoxysilane, isopropylmethyldimethoxysilane, isopropylethyldimethoxysilane, isopropylphenyldimethoxysilane, isopropyldimethylmethoxysilane, isopropyldiethylmethoxysilane, isopropyldiphenylmethoxysilane, isopropyltriethoxysilane, diisopropyldiethoxysilane, triisopropylethoxysilane, isopropylmethyldiethoxysilane, isopropylethyldiethoxysilane, isopropylphenyldiethoxysilane, isopropyldimethylethoxysilane, isopropyldiethylethoxysilane, isopropyldiphenylethoxysilane, sec-butyltrimethoxysilane, di sec-butyldimethoxysilane, tri sec-butylmethoxysilane, sec-butylmethyldimethoxysilane, sec-butylethyldimethoxysilane, sec-butylphenyldimethoxysilane, sec-butyldimethylmethoxysilane, sec-butyldiethylmethoxysilane, sec-butyldiphenylmethoxysilane, etc. may be mentioned.

Further, sec-butyltriethoxysilane, di sec-butyldiethoxysilane, tri sec-butylethoxysilane, sec-butylmethyldiethoxysilane, sec-butylethyldiethoxysilane, sec-butylphenyldiethoxysiiane, sec-butyldimethylethoxysilane, sec-butyldiethylethoxysilane, sec-butyldiphenylethoxysilane, cyclopentyltrimethoxysilane, dicyclopentyldimethoqsilane, tricyclopentylmethoxysilane, cyclopentylmethyldimethoxysilane, cyclopentylethyldimethoxysilane, cyclopentylphenyldimethoxysilane, cyclopentyldimethylmethoxysilane, cyclopentyldiethylmethoxysilane, cyclopentyldiphenylmethoxysilane, etc. may be mentioned.

Further, cyclopentyltriethoxysilane, dicyclopentyldiethoxysilane, tricyclopentylethoxysilane, cyclopentylmethyldiethoxysilane, cyclopentylethyldiethoxysilane, cyclopentylphenyldiethoxysilane, cyclopentyldimethylethoxysilane, cyclopentyldiethylethoxysilane, cyclopentyldiphenylethoxysilane, cyclopentadienyltrimethoxysilane, dicyclopentadienyldimethoxysilane, tricyclopentadienylmethoxysilane, cyclopentadienylmethyldimethoxysilane, cyclopentadienylethyldimethoxysilane, cyclopentadienylphenyldimethoxysilane, cyclopentadienyldimethylmethoxysilane, cyclopentadienyldiethylmethoxysilane, cyclopentadienyldiphenylmethoxysilane, etc. may be mentioned.

Further, cyclopentadienyltriethoxysilane, dicyclopentadienyldiethoxysilane, tricyclopentadienylethoxysilane, cyclopentadienylmethyldiethoxysilane, cyclopentadienylethyldiethoxysilane, cyclopentadienylphenyldiethoxysilane, cyclopentadienyldimethylethoxysilane, cyclopentadienyldiethylethoxysilane, cyclopentadienyldiphenylethoxysilane, cyclohexyltrimethoxysilane, dicyclohexyldimethoxysilane, tricyclohexylmethoxysilane, cyclohexylmethyldimethoxysilane, cyclohexylethyldimethoxysilane, cyclohexylphenyldimethoxysilane, cyclohexyldimethylmethoxysilane, cyclohexyldiethylmethoxysilane, cyclohexyldiphenylmethoxysilane, etc. may be mentioned.

Further, cyclohexyltriethoxysilane, dicyclohexyldiethoxysilane, tricyclohexylethoxysilane, cyclohexylmethyldiethoxysilane, cyclohexylethyldiethoxysilane, cyclohexylphenyldiethoxysilane, cyclohexyldimethylethoxysilane, cyclohexyldiethylethoxysilane, cyclohexyldiphenylethoxysilane, cyclohexenyltrimethoxysilane, dicyclohexenyldimethoxysilane, tricyclohexenylmethoxysilane, cyclohexenylmethyldimethoxysilne, cyclohexenylethyldimethoxysilane, cyclohexenyiphenyldimethoxysilane, cyclohexenyldimethylmethoxysilane, cyclohexenyldiethylmethoxysilane, cyclohexenyldiphenylmethoxysilane, etc. may be mentioned.

Further, cyclohexenyltriethoxysilane, dicyclohexenyldiethoxysilane, tricyclohexenylethoxysilane, cyclohexenylmethyldiethoxysilane, cyclohexenylethyldiethoxysilane, cyclohexenylphenyldiethoxysilane, cyclohexenyldimethylethoxysilane, cyclohexenyldiethylethoxysilane, cyclohexenyldiphenylethoxysilane, etc. may be mentioned.

Further, organic silane compounds including alkoxysilanes such as isopropylvinyldimethoxysilane, isopropylvinyldiethoxysilane, isopropylvinylditert-butoxysilane, diisopropylvinylmethoxysilane, diisopropylvinylethoxysilane, diisopropylvinyl tert-butoxysilane, isopropyldivinylmethoxysilane, isopropyldivinylethoxysilane, isopropyldivinyl tert-butoxysilane, isopropylvinylmethylmethoxysilane, isopropylvinylmethylethoxysilane, isopropylvinylmethyl tert-butoxysilane, isopropylvinylethylmethoxysilane, isopropylvinylethylethoxysilane, isopropylvinylethyl tert-butoxysilane, isopropylphenyldimethoxysilane, isopropylphenyldiethoxysilane, isopropylphenylditert-butoxysilane, diisopropylphenylmethoxysilane, diisopropylphenylethoxysilane, diisopropylphenyl tert-butoxysilane, isopropyldiphenylmethoxysilane, isopropyldiphenylethoxysilane, isopropyldiphenyl tert-butoxysilane, isopropylphenylmethylmethoxysilane, isopropylphenylmethyldiethoxysilane, isopropylphenylmethyl tert-butoxysilane, isopropylphenylethylmethoxysilane, isopropylphenylethyldiethoxysilane, isopropylphenylethyl tert-butoxysilane, sec-butylvinyldimethoxysilane, sec-butylvinyldiethoxysilane, sec-butylvinylditert-butoxysilane, disec-butylvinylmethoxysilane, disec-butylvinylethoxysilane, disec-butylvinyl tert-butoxysilane, sec-butyldivinylmethoxysilane, sec-butyldivinylethoxysilane, sec-butyldivinyl tert-butoxysilane, sec-butylphenyldimethoxysilane, sec-butylphenyldiethoxysilane, sec-butylphenylditert-butoxysilane, disec-butylphenylmethoxysilane, disec-butylphenylethoxysilane, disec-butylphenyl tert-butoxysilane, sec-butyldiphenylmethoxysilane, sec-butyldiphenylethoxysilane, sec-butyldiphenyl tert-butoxysilane, etc; haloalkoxysilanes such as an aryloxysilanedichlorodiethoxysilane, dichlorodiphenoxysilane, tribromoethoxysilane, etc.; and haloaryloxysilanes; etc. may be mentioned.

Further, polyalkoxypolysiloxanes such as hexamethoxydisiloxane, octamethoxytrisiloxane, decamethoxytetrasiloxane, hexaethoxydisiloxane, octaethoxytrisiloxane, decaethoxytetrasiloxane, etc.; and polyalkylpolyalkoxypolysiloxanes such as 1,3-dimethyl-1,1,3,3-tetramethoxydisiloxane, 1,3,5-trimethyl-1,1,3,5,5,-pentamethoxydisiloxane, 1,3,5,7-tetramethyl-1,1,3,5,7,7-hexamethoxydisiloxane, etc. may be exemplified.

Such alcohols, organic silanols and organic silicon compounds may be used alone or as a mixture of two or more of them.

By mixing and reacting the above-described components, a polymer composition of the present invention can be obtained. The polymer composition of the present invention is excellent in the refractive index, gas barrier property, mechanical strength, UV resistance, heat resistance and heat conductivity and can be a material having all of such properties. Such properties are of a level which cannot be sufficiently attained by conventional methyl group-substituted siloxane or phenyl group-substituted siloxane series.

Among materials of the present invention, particularly, a polymer composition having a structure represented by Si—O—Al or Si—O—Zn, is excellent in the above gas barrier property, mechanical strength, UV resistance, heat resistance and heat conductivity.

Such a polymer composition can be used as a sealing material. For example, it is useful for protecting and sealing LED chips, LED devices, semiconductors, power semiconductors, etc.

Further, by coating a resin component with the polymer composition of the present invention, it is possible to improve the gas barrier property of the resin component. Such a resin component may, for example, be a resin substrate or a resin film.

The sealing material and the protective film obtained by the present invention can be used as a FPD device or a semiconductor device. A resin component having an improved gas barrier property can be used as a FPD device.

EXAMPLES

Now, Examples will be described, but it should be understood that the present invention is by no means limited to such Examples.

Measurement of the film thickness was carried out by means of a stylus type surface roughness tester (Dektak 6M) manufactured by ULVAC.

The refractive index was measured by means of MEL-30S (automatic wavelength scanning ellipsometer) manufactured by JASCO Corporation or a multi-wavelength Abbe's refractometer (DR-M4 (wavelength: 589 nm)) manufactured by Atago Co., Ltd.

The total light transmittance was measured by the method in accordance with JIS K7361-1. The wavelength dependency of the light transmittance was measured by means of an ultraviolet and visible spectrophotometer (V-530 (measuring wavelength region: 250 nm to 850 nm)) manufactured by JASCO Corporation.

The UV irradiation test was carried out by means of EYE Super UV tester SUV-F1 manufactured by Iwasaki Electric Co., Ltd. under conditions of 68 mW/cm$^2$ (wavelength: 300 to 400 nm) and 120 hours.

The durometer hardness was measured in accordance with JIS 7215 by means of a durometer hardness meter Type A.

With respect to the heat conductivity, the density was measured by a water displacement method, the specific heat was measured by Pyris Diamond DSC manufactured by Perkin Elmer, and the thermodiffusion coefficient was measured by means of a laser flash analyzer (LFA-502) manufactured by Kyoto Electronics Manufacturing Co., Ltd., whereupon the heat conductivity was calculated.

The oxygen permeability was measured by the method in accordance with JIS K7126-1, and the water permeability was measured by the method in accordance with JIS K7129A.

CP/MAS NMR (Cross Polarization/Magic Angle Spinning Nuclear Magnetic Resonance) of $^{29}$Si was measured by VNMRS-400 manufactured by Varian.

Example 1

[Preparation of Metal Catalyst Composed of Platinum and Cyclic Siloxane Having Silicon Atom to which Vinyl Group and Secondary Carbon Atom are Directly Bonded ]

Into a 50 ml Schlenk flask reactor equipped with a stirrer, 17.1 g (50 mmol) of 2,4,6-trivinyl-2,4,6-triisopropylcyclotrisiloxane prepared in accordance with the method disclosed in JP-A-2005-51192, 16.4 ml of ethanol and 2.59 g (5.0 mmol) of chloroplatinic acid hexahydrate were charged under a nitrogen stream and stirred at room temperature to obtain a uniform solution. To this uniform solution, 4.20 g (50 mmol) of sodium hydrogencarbonate was added in 10 minutes, followed by stirring at 70° C. for 6 hours. The obtained suspension was filtrated through a glass filter to filter off a gray residue and to obtain a transparent yellow platinum catalyst solution. The concentration of platinum in the obtained transparent yellow platinum catalyst solution was 0.297 mmol/g.

[Preparation of Polymer Composition]

In a 50 ml Schlenk flask reactor equipped with a stirrer, 5.71 g (Al content: 10 mmol) of a 20 wt % hexane solution of triethylaluminum was added to 4.30 g (Si content: 50 mmol) of polymethylvinylsiloxane having a weight average molecular weight of 1,200, under a nitrogen stream, followed by stirring at room temperature for 20 hours. To the obtained reaction solution, 3.00 g (Si content: 50 mmol) of polymethylhydrogensiloxane having a weight average molecular weight of 1,600 was added, followed by stirring at room temperature for 1 hour, whereupon 0.034 g (0.010 mmol) of the platinum catalyst solution prepared as described above was added, followed by stirring at room temperature for 1 hour to obtain a hexane solution of the polymer composition.

[Application of Polymer Composition to Silicon Substrate]

The above hexane solution of the polymer composition was applied to a silicon substrate (n-type Si substrate having a thickness of 200 mm, manufactured by Philtech Inc.) by a bar coater and dried by removing the solvent under conditions of 100° C. for 5 minutes. The polymer composition film was uniform and transparent, and its thickness was 10 urn. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.490.

Comparative Example 1

A polymer composition was prepared in the same manner as in Example 1 except that 5.00 g of hexane was used instead of the 20 wt % hexane solution of triethylaluminum used in the preparation of the polymer composition in Example 1, and the polymer composition was applied to a silicon substrate and dried. The polymer composition film was uniform and transparent, and its thickness was 10 μm. Cross-cuts of 10×10=100 grid squares (1 mm square each) were formed, and a peeling test was carried out by means of a scotch tape, whereby out of 100 squares, 13 squares were peeled. Further, in a heat resistance test by heating at 150° C. for 5 hours, cracking and peeling were observed. The refractive index was measured and found to be 1.451.

Example 2

A polymer composition was prepared in the same manner as in Example 1 except that 6.71 g (Zn content: 10 mmol) of a 18.4 wt % hexane solution of diethylzinc was used instead of the 20 wt % hexane solution of triethylaluminum used in the preparation of the polymer composition in Example 1, and the polymer composition was applied to a silicon substrate.

The polymer composition film was uniform and transparent, and its thickness was 10 μm. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.620.

Example 3

[Preparation of Polymer Composition]

In a 50 ml Schlenk flask reactor equipped with a stirrer, 1.36 g (5.0 mmol) tetraethoxyzirconium was added to 4.30 g (Si content: 50 mmol) of polymethylvinylsiloxane having a weight average molecular weight of 1,200, under a nitrogen stream, followed by stirring at room temperature for 20 hours, whereupon 5.71 g (Al content: 10 mmol) of a 20 wt % hexane solution of triethylaluminum was added, followed by further stirring at room temperature for 20 hours. To the obtained reaction solution, 3.00 g (Si content: 50 mmol) of polymethylhydrogensiloxane having a weight average molecular weight of 1,600 was added, followed by stirring at room temperature for 1 hour, whereupon 0.034 g (0.010 mmol) of the platinum catalyst solution prepared as in Example 1 was added, followed by stirring at room temperature for 1 hour to obtain a hexane solution of the polymer composition.

[Application of Polymer Composition to Silicon Substrate]

The above hexane solution of the polymer composition was applied to a silicon substrate by a bar coater and dried by removing the solvent under conditions of 100° C. for 5 minutes. The polymer composition film was uniform and transparent, and its thickness was 10 μm. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.788.

Example 4

[Preparation of Polymer Composition]

In a 50 ml Schlenk flask reactor equipped with a stirrer, 2.84 g (Al content: 5.0 mmol) of a 20 wt % hexane solution of ethylaluminum was added to 4.30 g (Si content: 50 mmol) of polymethylvinylsiloxane having a weight average molecular weight of 1,200, under a nitrogen stream, followed by stirring at room temperature for 20 hours. To the obtained reaction solution, 3.00 g (Si content: 50 mmol) of polymethylhydrogensiloxane having a weight average molecular weight of 1,600 was added, followed by stirring at room temperature for 1 hour, whereupon 0.0034 g (0.001 mmol) of the platinum catalyst solution prepared in Example 1 was added, followed by stirring at room temperature for 1 hour to obtain a colorless transparent hexane solution of the polymer composition.

[Application of Polymer Composition to Silicon Substrate]

The above hexane solution of the polymer composition was applied to a silicon substrate by a bar coater and dried by removing the solvent under conditions of 100° C. for 5 minutes. The polymer composition film was uniform and transparent, and its thickness was 449 nm. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.533.

Comparative Example 2

A polymer composition was prepared in the same manner as in Example 4 except that 5.00 g of hexane was used instead of the 20 wt % hexane solution of triethylaluminum used in the preparation of the polymer composition in Example 4, and the polymer composition was applied to a silicon substrate. The polymer composition film was uniform and transparent, and its thickness was 504 nm. Cross-cuts of 10×10=100 grid squares (1 mm square each) were formed, and a peeling test was carried out by means of a scotch tape, whereby out of 100 squares, 13 squares were peeled. Further, also in a heat resistance test by heating at 150° C. for 5 hours, cracking and peeling were observed. The refractive index was measured and found to be 1.451.

Example 5

A colorless transparent polymer composition was prepared in the same manner as in Example 4 except that 3.36 g (Zn content: 5.0 mmol) of a 18.4 wt % hexane solution of diethylzinc was used instead of the 20 wt % hexane solution of triethylaluminum used in the preparation of the polymer composition in Example 4, and the polymer composition was applied to a silicon substrate.

The polymer composition film was uniform and transparent, and its thickness was 507 nm. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.690.

Example 6

[Preparation of Polymer Composition]

In a 50 ml Schlenk flask reactor equipped with a stirrer, 1.36 g (5.0 mmol) of tetraethoxyzirconium was added to 4.30 g (Si content: 50 mmol) of polymethylvinylsiloxane having a weight average molecular weight of 1,200, under a nitrogen stream, followed by stirring at room temperature for 20 hours, whereupon 2.84 g (Al content: 5.0 mmol) of a 20 wt % hexane solution of triethylaluminum was added, followed by stirring further at room temperature for 20 hours. To the obtained reaction solution, 3.00 g (Si content: 50 mmol) of polymethylhydrogensiloxane having a weight average molecular weight of 1,600 was added, followed by stirring at room temperature for 1 hour, whereupon 0.0034 g (0.001 mmol) of the platinum catalyst solution prepared in Example 1 was added, followed by stirring at room temperature for 1 hour to obtain a colorless transparent hexane solution of the polymer composition.

[Application of Polymer Composition to Silicon Substrate]

The above hexane solution of the polymer composition was applied to a silicon substrate by a bar coater and dried by removing the solvent under conditions of 100° C. for 5 minutes. The polymer composition film was uniform and transparent, and its thickness was 1,412 nm. Cross-cuts of 10×10=100 grid squares (1 mm square each) were formed, and a peeling test was carried out by means of a scotch tape, whereby no peeling was observed. Further, also in a heat resistance test by heating at 150° C. for 5 hours, yellowing, cracking or peeling was not observed. The refractive index was measured and found to be 1.790.

Example 7

[Preparation of Polymer Composition]

In a 50 ml Schlenk flask reactor equipped with a stirrer, 7.10 g (Al content: 12.5 mmol) of a 20 wt % hexane solution of triethylaluminum was added to 4.30 g (Si content: 50 mmol) of polymethylvinylsiloxane having a weight average molecular weight of 1,200, in a nitrogen stream, followed by stirring at room temperature for 20 hours. From the obtained reaction solution, hexane was distilled off under reduced pressure to obtain a colorless transparent Al-containing polymer.

To the obtained Al-containing polymer, 3.00 g (Si content: 50 mmol) of polymethylhydrogensiloxane having a weight average molecular weight of 1,600 was added, followed by stirring at room temperature for 1 hour, whereupon 0.0034 g (0.001 mmol) of the platinum catalyst solution prepared in Example 1 was added, followed by stirring at room temperature for 1 hour to obtain a colorless transparent polymer composition.

[Molding of Polymer Composition]

Into a glass mold of 50 mm×50 mm×2.0 mm in thickness, the above polymer composition was cast and heat-cured under conditions of 150° C. for 1 hour to obtain a cured plate sample of the polymer composition.

The obtained cured plate sample of the polymer composition was colorless and transparent, and its surface was flat and smooth.

The refractive index of the obtained cured plate sample was measured and found to be 1.557. Further, its total light transmittance was 91.5%, and after the UV irradiation test, the total light transmittance was maintained to be 91.5%. The wavelength dependency of the light transmittance was such that the light transmittance was at least 97.0% within the measured wavelength range, and after the UV irradiation test, the light transmittance was maintained to be at least 97.0%. That is, the UV resistance was found to be high.

The durometer hardness of the obtained cured plate sample was 97.5, and after a heat resistance test of repeating temperature up and down from 150° C. to 260° C. three times, 97.5 was maintained. Further, after the heat resistance test of repeating temperature up and down from 150° C. to 260° C. three times, cracking, breakage or color change such as yellowing was not observed. That is, the heat resistance was found to be high.

The heat conductivity of the obtained cured plate sample was 0.230 W/m·K, the oxygen permeability was 1,325 cc/m²·day, and the water permeability was 14.8 g/m²·day.

The obtained cured plate sample was analyzed by $^{29}$Si CP/MAS NMR, whereby a peak attributable to Si—O—Al was observed at δ-110 ppm. That is, it was found that a primary structure chain comprising silicon, oxygen and aluminum was formed.

Example 8

A colorless transparent polymer composition was prepared and a cured plate sample of the polymer composition was obtained, in the same manner as in Example 7, except that 8.40 g (Zn content: 12.5 mmol) of a 18.4 wt % hexane solution of diethylzinc was used instead of the 20 wt % hexane solution of triethylaluminum used in the preparation of the polymer composition in Example 7.

The obtained cured plate sample of the polymer composition was colorless and transparent, and its surface was flat and smooth.

The refractive index of the obtained cured plate sample was measured and found to be 1.630. Further, its total light transmittance was 91.8%, and after the UV irradiation test, the total light transmittance was maintained to be 91.8%. The wavelength dependency of the light transmittance was such that the light transmittance was at least 97.0% within the measured wavelength range, and after the UV irradiation test, 97.0% was maintained. That is, the UV resistance was found to be high.

The durometer hardness of the obtained cured plate sample was 96.0, and after a heat resistance test of repeating temperature up and down from 150° C. to 260° C. three times, 96.0 was maintained. Further, after the heat resistance test of repeating temperature up and down from 150° C. to 260° C. three times, cracking, breakage or color change such as yellowing was not observed. That is, the heat resistance was found to be high.

The heat conductivity of the obtained cured plate sample was 0.251 W/m·K, the oxygen permeability was 1,032 cc/m²·day, and the water permeability was 12.5 g/m²·day.

Comparative Example 3

A polymer composition was prepared in the same manner as in Example 7 except that the 20 wt % hexane solution of triethylaluminum used in the preparation of the polymer composition in Example 7, was not added, to prepare a colorless transparent polymer composition and to obtain a cured plate sample of the polymer composition in the same manner as in Example 7.

The obtained cured plate sample of the polymer composition was colorless and transparent, and its surface was flat and smooth.

The refractive index of the obtained cured plate sample was measured and found to be 1.448. Further, its total light transmittance was 90.5%, and after the UV irradiation test, the total light transmittance decreased to 76.8%. Further, the wavelength dependency of the light transmittance was such that the light transmittance was at least 97.0% within the measured wavelength range, but after the UV irradiation test, it decreased to 89.2%. That is, by the UV irradiation, the polymer composition was remarkably deteriorated. That is, the UV resistance was found to be low.

The durometer hardness of the obtained cured plate sample was 77.2, and after a heat resistance test of repeating temperature up and down from 150° C. to 260° C. three times, it decreased to 65.4. Further, after the heat resistance test of repeating temperature up and down from 150° C. to 260° C. three times, cracking and breakage were observed, and a color change to yellow was observed. That is, the heat resistance was found to be low.

The heat conductivity of the obtained cured plate sample was 0.195 W/m·K, which was low as compared with the heat conductivity in Examples 7 and 8.

The oxygen permeability of the obtained cured plate sample was 8,516 cc/m²·day, and the water permeability was 68.3 g/m²·day, and it was found that the oxygen permeability and water permeability were high as compared with those in Examples 7 and 8, and the gas barrier property is low.

Example 9

[Preparation of Polymer Composition]

In a 50 ml Schlenk flask reactor equipped with a stirrer, 7.10 g (Al content: 12.5 mmol) of a 20 wt % hexane solution of triethylaluminum was added to 5.70 g (Si content: 50 mmol) of polyisopropylvinylsiloxane having a weight average molecular weight of 30,000, in a nitrogen stream, followed by stirring at room temperature for 20 hours. From the obtained reaction solution, hexane was distilled off under reduced pressure to obtain a colorless transparent Al-containing polymer.

To the obtained Al-containing polymer, 3.00 g (Si content: 50 mmol) of polymethylhydrogensiloxane having a weight average molecular weight of 1,600 was added, followed by stirring at room temperature for 1 hour, whereupon 0.0034 g (0.001 mmol) of the platinum catalyst solution prepared in Example 1 was added, followed by stirring at room temperature for 1 hour to obtain a colorless transparent polymer composition.

[Molding of Polymer Composition]

Into a glass mold of 50 mm×50 mm×2.0 mm in thickness, the above polymer composition was cast and heat-cured at 150° C. for 1 hour to obtain a cured plate sample of the polymer composition.

The obtained cured plate sample of the polymer composition was colorless and transparent, and its surface was flat and smooth.

The refractive index of the obtained cured plate sample was measured and found to be 1.572. Further, its total light transmittance was 91.2%, and after the UV irradiation test, the total light transmittance was maintained to be 91.2%. The wavelength dependency of the light transmittance was such that the light transmittance was at least 97.0% within the measured wavelength range, and after the UV irradiation test, at least 97.0% was maintained. That is, the UV resistance was found to be high.

The durometer hardness of the obtained cured plate sample was 98.5, and after a heat resistance test of repeating temperature up and down from 150° C. to 260° C. three times, 98.5 was maintained. Further, after the heat resistance test of repeating temperature up and down from 150° C. to 260° C. three times, cracking, breakage or color change such as yellowing was not observed. That is, the heat resistance was found to be high.

The heat conductivity of the obtained cured plate sample was 0.230 W/m·K, the oxygen permeability was 1,150 cc/m²·day, and the water permeability was 13.8 g/m²·day.

The obtained cured plate sample was analyzed by $^{29}$Si CP/MAS NMR, whereby a peak attributable to Si—O—Al was observed at 6-110 ppm. That is, it was found that a primary structure chain comprising silicon, oxygen and aluminum was formed.

Example 10

[Preparation of Polymer Composition]

In a 50 ml Schlenk flask reactor equipped with a stirrer, 7.10 g (Al content: 12.5 mmol) of a 20 wt % hexane solution of triethylaluminum was added to 4.30 g (Si content: 50 mmol) of polymethylvinylsiloxane having a weight average molecular weight of 30,000, in a nitrogen stream, followed by stirring at room temperature for 20 hours. To the obtained reaction solution, 5.56 g (75 mmol) of sec-butanol was added, followed by stirring at room temperature for 3 hours. From the obtained reaction solution, hexane and non-reacted 2-butanol were distilled off under reduced pressure to obtain a colorless transparent Al-containing polymer.

To the obtained Al-containing polymer, 3.00 g (Si content: 50 mmol) of polymethylhydrogensiloxane having a weight average molecular weight of 1,600 was added, followed by stirring at room temperature for 1 hour, whereupon 0.0034 g (0.001 mmol) of the platinum catalyst solution prepared in Example 1 was added, followed by stirring at room temperature for 1 hour to obtain a colorless transparent polymer composition.

[Molding of Polymer Composition]

Into a glass mold of 50 mm×50 mm×2.0 mm in thickness, the above polymer composition was cast and heat-cured under conditions of 150° C. for 1 hour to obtain a cured plate sample of the polymer composition.

The obtained cured plate sample of the polymer composition was colorless and transparent, and its surface was flat and smooth.

The refractive index of the obtained cured plate sample was measured and found to be 1.552. Further, its total light transmittance was 91.8%, and after the UV irradiation test, the total light transmittance was maintained to be 91.8%. The wavelength dependency of the light transmittance was such that the light transmittance was at least 98.0% within the measured wavelength range, and after the UV irradiation test, at least 98.0% was maintained. That is, the UV resistance was found to be high.

The durometer hardness of the obtained cured plate sample was 98.0, and after a heat resistance test of repeating temperature up and down from 150° C. to 260° C. three times, 98.0 was maintained. Further, after the heat resistance test of repeating temperature up and down from 150° C. to 260° C. three times, cracking, breakage or color change such as yellowing was not observed. That is, the heat resistance was found to be high.

The heat conductivity of the obtained cured plate sample was 0.229 W/m·K, the oxygen permeability was 1,210 cc/m²·day, and the water permeability was 14.5 g/m²·day.

Comparative Example 4

A polymer composition was prepared and a cured plate sample of the polymer composition was prepared in the same manner as in Example 7 except that 2.55 g (Al content: 12.5 mmol) of aluminumisopropoxide and 10.0 g of hexane were used instead of the 20 wt % hexane solution of triethylaluminum used in the preparation of the polymer composition in Example 7.

The polymer composition was a turbid viscous slurry and non-uniform. The cured plate sample of the polymer composition was turbid and non-transparent, and its surface had irregularities and was not flat.

Comparative Example 5

A polymer composition was prepared in the same manner as in Example 7 except that 3.08 g (Al content: 12.5 mmol) of aluminum sec-butoxide and 12.0 g of hexane were used instead of the 20 wt % hexane solution of triethylaluminum used in the preparation of the polymer composition in Example 7, to obtain a colorless transparent polymer composition.

A cured plate sample of the polymer composition was prepared in the same manner as in Example 7, whereby its surface was flat and smooth, but the surface was turbid and non-transparent.

Example 11

A colorless transparent polymer composition was prepared and a cured plate sample of the polymer composition was obtained in the same manner as in Example 10 except that 1.50 g (12.5 mmol) of dimethyldimethoxysilane was used instead of sec-butanol in the preparation of the polymer composition in Example 10.

The obtained cured plate sample of the polymer composition was colorless and transparent, and its surface was flat and smooth.

The refractive index of the obtained cured plate sample was measured and found to be 1.550. Further, its total light transmittance was 91.9%, and after the UV irradiation test, the total light transmittance was maintained to be 91.9%. The wavelength dependency of the light transmittance was such that the light transmittance was at least 98.0% within the measured wavelength range, and after the UV irradiation test, at least 98.0% was maintained. That is, the UV resistance was found to be high.

The durometer hardness of the obtained cured plate sample was 98.0, and after a heat resistance test of repeating temperature up and down from 150° C. to 260° C. three times, 98.0 was maintained. Further, after the heat resistance test of repeating temperature up and down from 150° C. to 260° C. three times, cracking, breakage or color change such as yellowing was not observed. That is, the heat resistance was found to be high.

The heat conductivity of the obtained cured plate sample was 0.229 W/m·K, the oxygen permeability was 1,430 cc/$m^2$·day, and the water permeability was 16.5 g/$m^2$·day.

Industrial Applicability

The polymer composition of the present invention is useful as a sealing material, a protective film and a gas barrier material, excellent in the gas barrier property, mechanical strength, UV resistance, heat resistance, etc., and it is thereby possible to provide a resin component having a gas barrier property, an LED device, a semiconductor device, etc.

The entire disclosure of Japanese Patent Application No. 2010-139215 filed on Jun. 18, 2010 including specification, claims and summary is incorporated herein by reference in its entirety.

The invention claimed is:

1. A process for producing a polymer composition, which comprises mixing and reacting:

as component (A), an unsaturated group-containing siloxane compound of the following formula (1):

$$\left[ \begin{array}{c} (H_2C)_a \\ | \\ -Si-O- \\ | \\ R^1 \end{array} \right]_m \quad (1)$$

wherein $R^1$ is a hydrogen atom or a $C_{1-20}$ hydrocarbon group, m is an integer of at least 3, a is an integer of from 0 to 10, and the siloxane structure is a chain or cyclic structure, as component (B), a siloxane compound having a structure of the following formula (2) wherein hydrogen is directly bonded to silicon, $$\left[ \begin{array}{c} H \\ | \\ -Si-O- \\ | \\ R^2 \end{array} \right]_n \quad (2)$$

wherein $R^2$ is a $C_{1-20}$ hydrocarbon group, n is an integer of at least 3, and the siloxane structure is a chain or cyclic structure, as component (C), at least one member selected from the group consisting of organic metal compounds of Group 1, 2, 12, 13 and 14 metals of the periodic table, having a structure in which at least one carbon atom is directly bonded to a metal, and as component (D), a metal catalyst of Group 8, 9 or 10 metal of the periodic table.

2. The process according to claim 1, wherein to 1 mol of the Si content in component (A), the Si content in component (B) is within a range of from 0.01 mol to 1,000 mol, the content of the organic metal compound as component (C) is within a range of from 0.001 mol to 100 mol, and the content of the metal catalyst as component (D) is within a range of from 0.00001 mol to 10 mol.

3. The process according to claim 1, wherein a compound of the following formula (4) is further added:

$$[O_pM_u(OR^7)_qX_r]_y \quad (4)$$

wherein M is Ti, Zr or Hf, $R^7$ is a $C_{1-20}$ hydrocarbon group, X is fluorine, chlorine, bromine or iodine, p, q, u and r are p≥0, q>0, u≥1 and r≥0, respectively, and represent numbers compatible with atomic valences of Ti, Zr and Hf, and y is an integer.

4. The process according to claim 1, wherein an alcohol, an organic silanol or an organic silicon compound is further added which reacts with an organic metal compound of Group 1, 2, 12, 13 or 14 metal of the periodic table, having a structure in which at least one carbon atom is directly bonded to a metal, as component (C), or lets the organic metal compound form a complex.

5. The process according to claim 1, wherein component (C) is an organic aluminum compound or an organic zinc compound.

6. The process according to claim 1, wherein component (D) is a platinum catalyst or a ruthenium catalyst.

7. A polymer composition produced by the process as defined in claim 1.

8. A sealing material containing the polymer composition as defined in claim 7.

9. A gas barrier material containing the polymer composition as defined in claim 7.

10. An insulating and sealing material for semiconductors, containing the polymer composition as defined in claim 7.

11. An LED device using the sealing material as defined in claim 8.

12. A resin component using the gas barrier material as defined in claim 9.

13. A semiconductor device using the insulating and sealing material for semiconductors, as defined in claim 10.

* * * * *